United States Patent
Song et al.

(10) Patent No.: US 8,773,922 B2
(45) Date of Patent: Jul. 8, 2014

(54) NON-VOLATILE MEMORY DEVICE, MEMORY CARD AND SYSTEM, AND METHOD DETERMINING READ VOLTAGE BY COMPARING REFERENCED PROGRAM DATA WITH COMPARATIVE READ DATA

(75) Inventors: Seung-Hwan Song, Suwon-si (KR); Jaehong Kim, Seoul (KR); Kyoung Lae Cho, Yongin-si (KR); Yong June Kim, Seoul (KR); Jun Jin Kong, Yongin-si (KR); Jong Han Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 343 days.

(21) Appl. No.: 12/614,545

(22) Filed: Nov. 9, 2009

(65) Prior Publication Data
US 2010/0118608 A1 May 13, 2010

(30) Foreign Application Priority Data
Nov. 10, 2008 (KR) ........................ 10-2008-0111056

(51) Int. Cl.
*G11C 7/06* (2006.01)

(52) U.S. Cl.
USPC .................................... 365/189.07

(58) Field of Classification Search
USPC ............. 365/189.15, 189.07, 185.01–185.33, 365/210.12
See application file for complete search history.

(56) References Cited

U.S. PATENT DOCUMENTS

| 7,542,344 | B2 * | 6/2009 | Kim ......................... 365/185.12 |
| 2007/0189107 | A1 * | 8/2007 | Kim et al. ................ 365/185.03 |
| 2008/0192541 | A1 * | 8/2008 | Kang et al. .............. 365/185.03 |
| 2009/0168543 | A1 * | 7/2009 | Kim et al. ................ 365/185.29 |
| 2009/0323942 | A1 * | 12/2009 | Sharon et al. .................... 380/44 |
| 2011/0016372 | A1 * | 1/2011 | Nelson et al. ................. 714/773 |
| 2013/0117635 | A1 * | 5/2013 | Ok et al. ....................... 714/773 |

FOREIGN PATENT DOCUMENTS

| CN | 101246744 A | 8/2008 |
| KR | 1020050064887 A | 6/2005 |
| KR | 1020070115755 A | 12/2007 |
| KR | 1020080012199 A | 2/2008 |

* cited by examiner

*Primary Examiner* — Vanthu Nguyen
*Assistant Examiner* — Khamdan Alrobaie
(74) *Attorney, Agent, or Firm* — Volentine & Whitt, PLLC

(57) ABSTRACT

A non-volatile semiconductor memory device and related method of determining a read voltage are disclosed. The non-volatile semiconductor memory device includes; a memory cell array including a plurality of memory cells, a read voltage determination unit configured to determine an optimal read voltage by comparing reference data obtained during a program operation with comparative data obtained during a subsequent read operation and changing a current read voltage to a new read voltage based on a result of the comparison, and a read voltage generation unit configured to generate the new read voltage in response to a read voltage control signal provided by the read voltage determination unit.

14 Claims, 13 Drawing Sheets

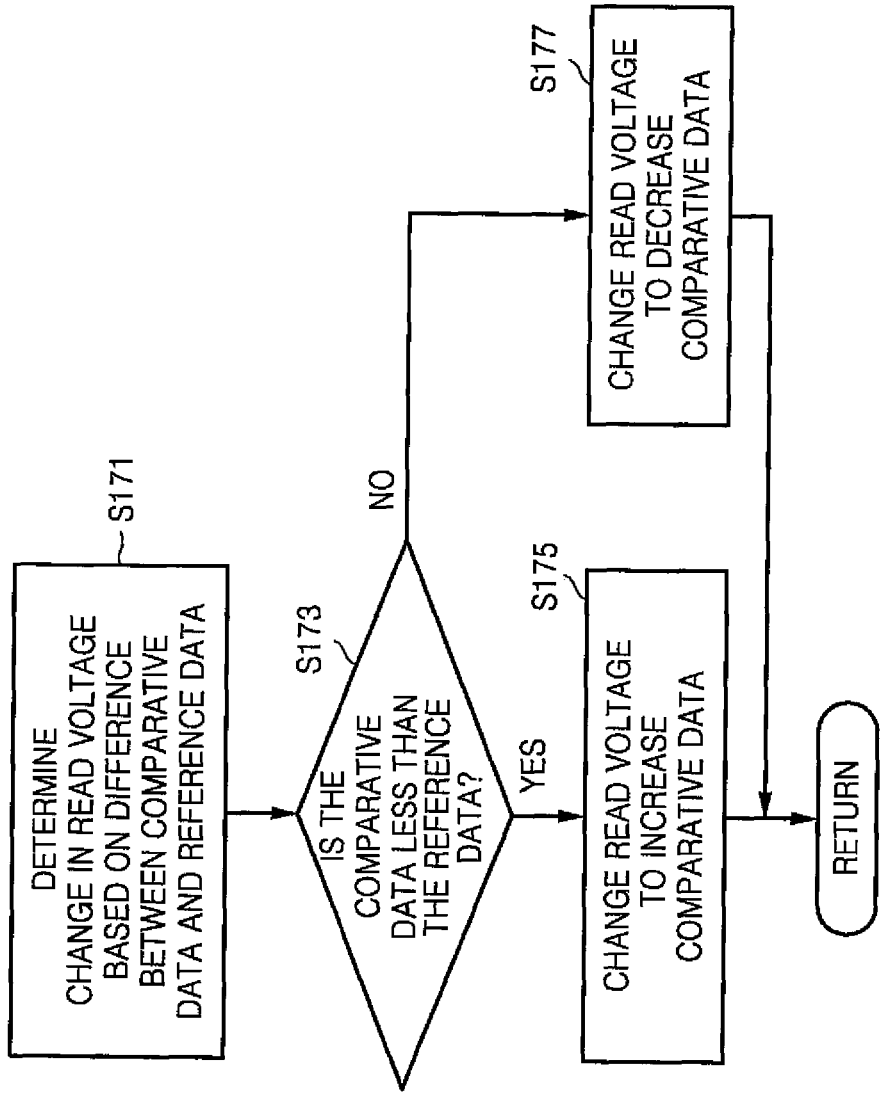

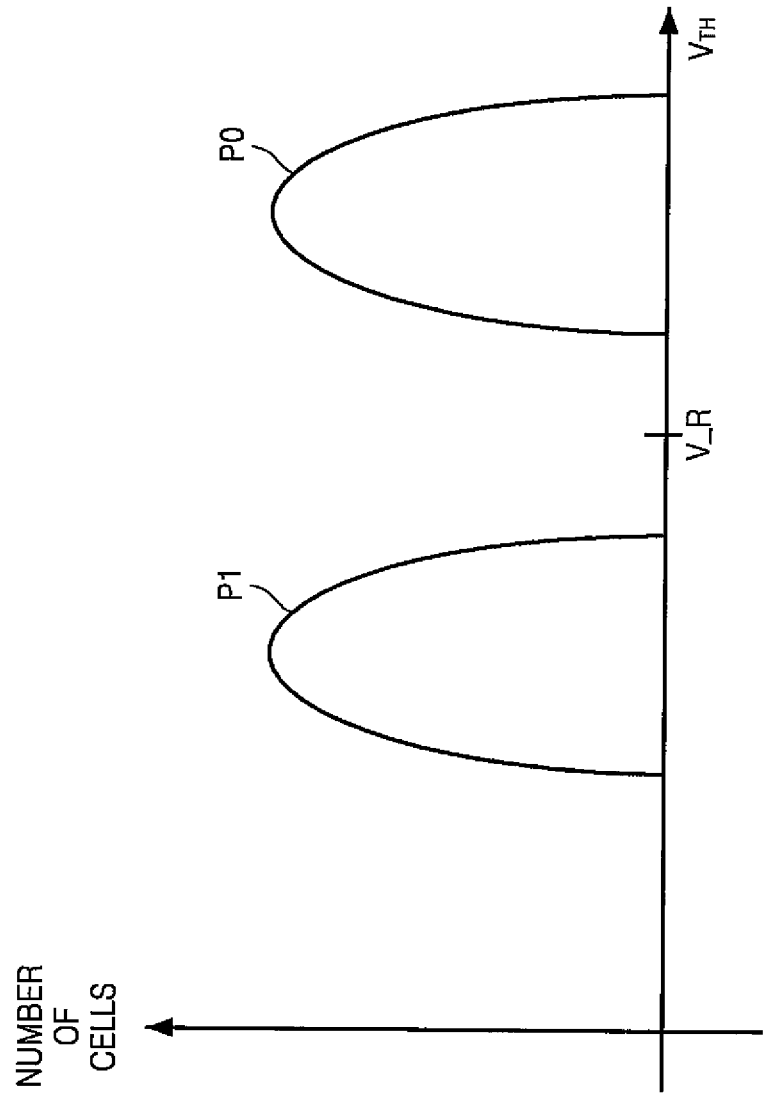

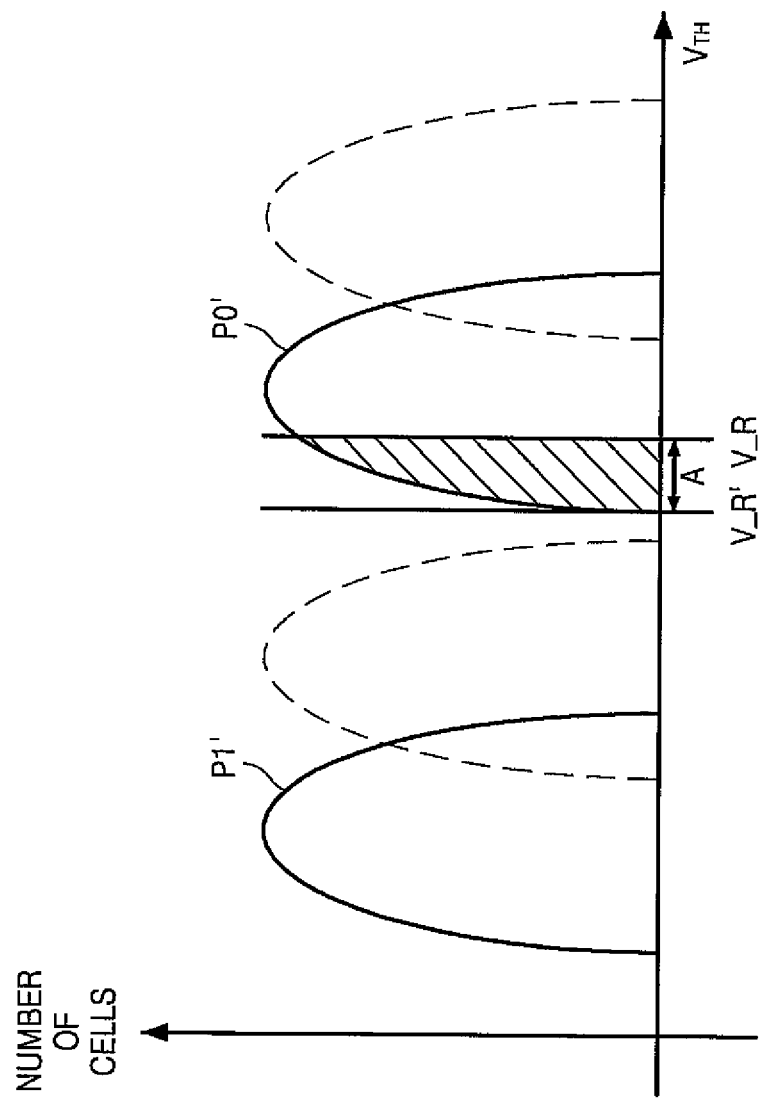

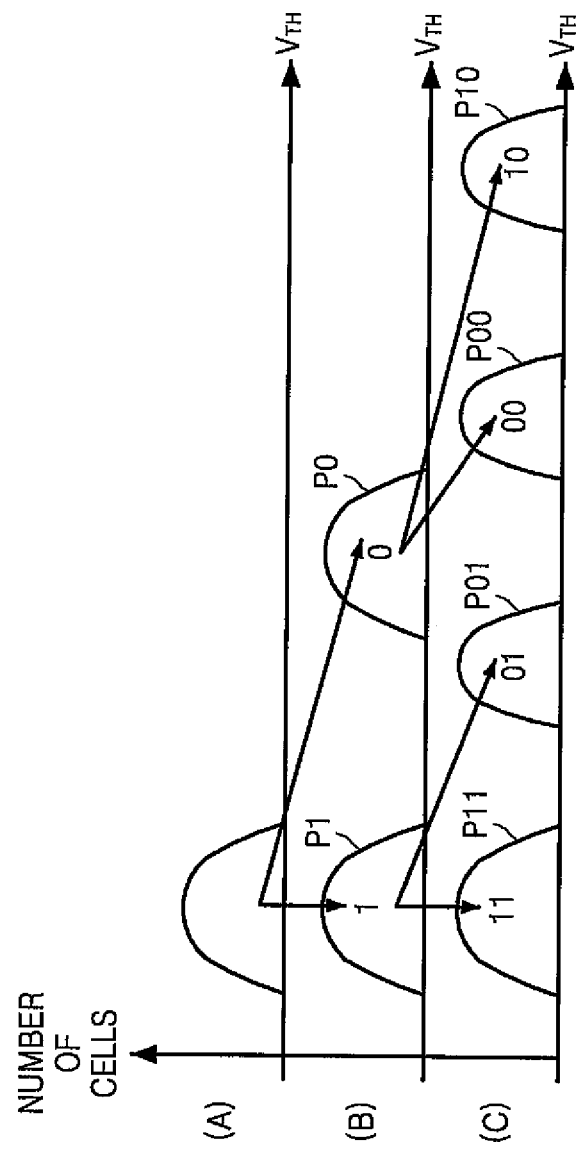

NON-VOLATILE MEMORY DEVICE, MEMORY CARD AND SYSTEM, AND METHOD DETERMINING READ VOLTAGE BY COMPARING REFERENCED PROGRAM DATA WITH COMPARATIVE READ DATA

CROSS-REFERENCE TO RELATED APPLICATIONS

This application claims the benefit of Korean Patent Application No. 10-2008-0111056 filed on Nov. 10, 2008, the subject matter of which is hereby incorporated by reference.

BACKGROUND

The inventive concept relates to semiconductor memory devices, and more particularly to a method of determining a read voltage for non-volatile semiconductor memory devices. The inventive concept also relates to memory cards and memory systems incorporating such memory devices.

Semiconductor memory devices (hereafter, "memory devices") include volatile memory devices and non-volatile memory devices. Volatile memory devices are generally characterized by fast data access write speeds, but lose stored data in the absence of applied power. In contrast, non-volatile memory devices generally provide slower data access speeds but retain stored data in the absence of applied power.

Conventional nonvolatile memory devices include phase-change random access memory (PRAM), mask read-only memory (MROM), programmable read-only memory (PROM), erasable programmable read-only memory (EPROM), and electrically erasable programmable read-only memory (EEPROM). With respect to MROM, PROM, and EPROM among nonvolatile memory devices, it is relatively difficult for users to enter (or update) data since erase and write operations cannot be freely performed. On the other hand, data may be electrically erased and written in EEPROM. Because of this ease of use, EEPROM has been increasingly used in various systems (including auxiliary data storage devices) as a data storage media for programming as well as payload data.

Within the broader class of EEPROM devices, flash EEPROM (hereinafter, "flash memory") is characterized by high integration density of memory elements and is thus very advantageous when used as a large-capacity auxiliary memory device. Accordingly, many types of flash memory are widely used in small electronic devices such as the digital camera, digital camcorder, digital music player, etc. These devices particularly benefit from the high data storage capacity, easy data access capabilities, and compact size of flash memory.

In its operation, flash memory determines whether electrons have been injected onto a floating gate via a conventionally understood phenomenon known as Fowler-Nordheim (F-N) tunneling. That is, the quantity of injected electrons on the floating gate may be interrupted as respective data states for a memory cell in flash memory (e.g., first and second logic levels for a binary memory cell). For example, during a program operation, a voltage of 15V is applied to the gate of the selected memory cell to enable F-N tunneling. As F-N tunneling proceeds and a greater quantity of electrons are injected onto the floating gate, the threshold voltage (Vth) of the memory increases. During an erase operation, a voltage of 20V is applied to the body (or semiconductor bulk) of the selected memory cell to again enable F-N tunneling. However, the flow of electrons from the floating gate during the erase operation is the reverse of the flow of electrons to the floating gate during the program operation. Accordingly, during the erase operation the threshold voltage Vth of the memory cell decreases.

Due to certain well known operating characteristics related to flash memory, the repeated execution of program and erase operations (or program/erase cycles) stresses and ultimately deteriorates the thin gate oxide film through which electrons pass during F-N tunneling. Once the gate oxide film deteriorates to a certain degree it is no longer capable of preventing the discharge, over time, of electrons injected onto the floating gate. This unintended discharge of electrical charge decreases the threshold voltage of the memory cell. Figure (FIG. 1 illustrates this life-cycle characteristic of flash memory.

FIG. 1 shows the migration of threshold voltage characteristics for a flash memory cell over its useful life (i.e., over a number of program/erase cycles). In FIG. 1, the upper graph (a) shows a memory cell threshold voltage distribution (hereafter "cell distribution") just after a successful program operation. The comparative lower graph (b) shows the cell distribution for the same flash memory cell following a period of time after programming. This drift in threshold voltage caused by a loss of stored charge through a deteriorated gate oxide film is symptomatic of a heavily worn flash memory cell (i.e., a memory cell degraded in its data storage capabilities by numerous program/erase cycles).

Referring to the graphs (a) and (b) of FIG. 1, it can be seen that the overall field of threshold voltage states (e.g., erase and P1-P7) for the flash memory cell is shifted to the left by generally reduced threshold voltage levels. Further, threshold voltage distribution broadening is apparent as respective threshold voltages become less distinct over time. Ultimately, the combined effects of shifted (reduced) threshold voltages and less distinct threshold voltages make data discrimination during a read operation to a heavily worn flash memory cell quite difficult, if not impossible.

The foregoing effects notwithstanding, a flash memory cell's threshold voltage distribution may also be shifted in the other direction (i.e., increased) by so-called coupling effects between proximate memory cells during program operations. Here again, any undesired shift (up or down) and/or broadening/narrowing of a threshold voltage distribution (collectively or individually "threshold voltage migration"), regardless of underlying cause, may result in data errors during subsequent read operations.

SUMMARY

Embodiments of the inventive concept provide memory devices capable of determining an optimal read voltage to be applied to memory cells during a read operation to thereby reduce data errors otherwise generated by threshold voltage migration. Embodiments of the inventive concept also provide memory cards and systems incorporating such memory devices, as well as methods for determining the optimal read voltage.

According to an aspect of the inventive concept, there is provided a method for determining a read voltage in a nonvolatile semiconductor memory device, the method comprising; obtaining read data from a plurality of memory cells using a current read voltage, extracting comparative data from the read data, and comparing the comparative data to reference data and to generate a comparison result, determining on the basis of the comparison result whether the initial read voltage is an optimal read voltage, if the current read voltage is not an optimal voltage, changing the current read voltage to a new read voltage on the basis of a difference value corresponding to the comparison result, and again obtaining the read data from the plurality of memory cells using the new read voltage.

According to another aspect of the inventive concept, there is provided a non-volatile semiconductor memory device comprising; a memory cell array including a plurality of memory cells, a read voltage determination unit configured to determine an optimal read voltage by comparing reference data obtained during a program operation with comparative data obtained during a subsequent read operation and changing a current read voltage to a new read voltage based on a result of the comparison, and a read voltage generation unit configured to generate the new read voltage in response to a read voltage control signal provided by the read voltage determination unit.

According to another aspect of the inventive concept, there is provided a memory card comprising; at least one non-volatile semiconductor memory device and a memory controller controlling the execution of program and read operations within the non-volatile semiconductor memory device, wherein the non-volatile semiconductor memory device comprises; a memory cell array including a plurality of memory cells, a read voltage determination unit configured to determine an optimal read voltage by comparing reference data obtained during a program operation with comparative data obtained during a subsequent read operation and changing a current read voltage to a new read voltage based on a result of the comparison, and a read voltage generation unit configured to generate the new read voltage in response to a read voltage control signal provided by the read voltage determination unit.

According to another aspect of the inventive concept, there is provided a system comprising; a central processing unit controlling overall operation of the system, a non-volatile semiconductor memory device storing data, and a memory controller controlling execution of program and read operations in the non-volatile semiconductor memory device under the control of the central processing unit. The non-volatile semiconductor memory device comprises; a memory cell array including a plurality of memory cells, a read voltage determination unit configured to determine an optimal read voltage by comparing reference data obtained during a program operation with comparative data obtained during a subsequent read operation and changing a current read voltage to a new read voltage based on a result of the comparison, and a read voltage generation unit configured to generate the new read voltage in response to a read voltage control signal provided by the read voltage determination unit.

BRIEF DESCRIPTION OF THE DRAWINGS

Exemplary embodiments of the inventive concept will be more clearly understood from the following detailed description taken in conjunction with the accompanying drawings in which:

FIG. 5 is a flowchart further explaining the step of changing the read voltage in the method of FIG. 4;

FIGS. 6A and 6B are cell distribution graphs explaining the operation of determining the read voltage according to an embodiment of the inventive concept;

FIGS. 7-9 are graphs and diagrams explaining an embodiment of the inventive concept as applied to a memory device including 2-bit MLC memory cells;

DETAILED DESCRIPTION OF THE EMBODIMENTS

Figure 1:
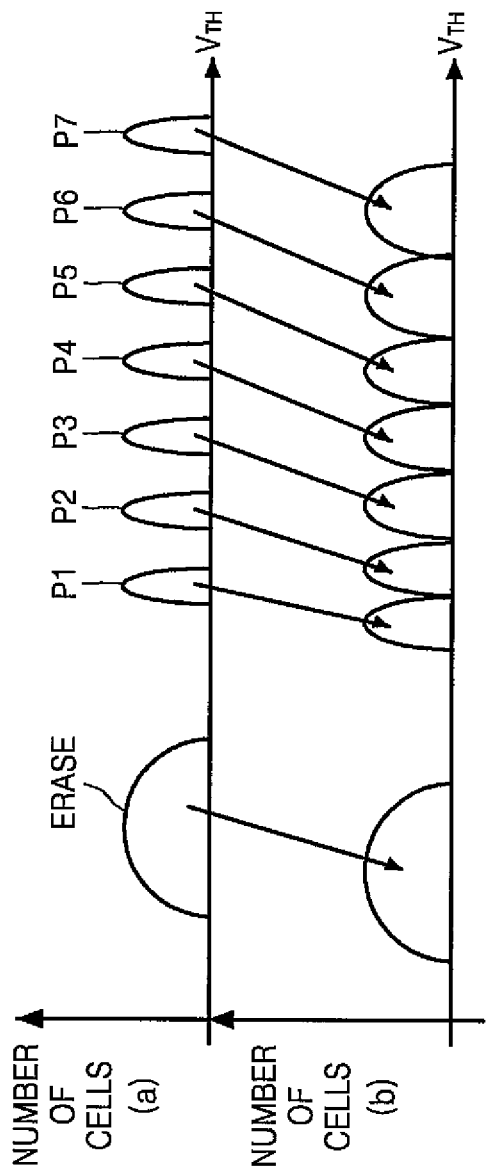
FIG. 1 graphically illustrates characteristics of cell threshold voltage migration for a flash memory device according to the repetition of a program/erase cycle.

The attached drawings for illustrating embodiments of the inventive concept are referred to in order to gain a sufficient understanding of the inventive concept and the merits thereof. Hereinafter, the inventive concept will be described in detail by explaining embodiments of the inventive concept with reference to the attached drawings. Like reference numerals in the drawings denote like elements.

Figure 2:
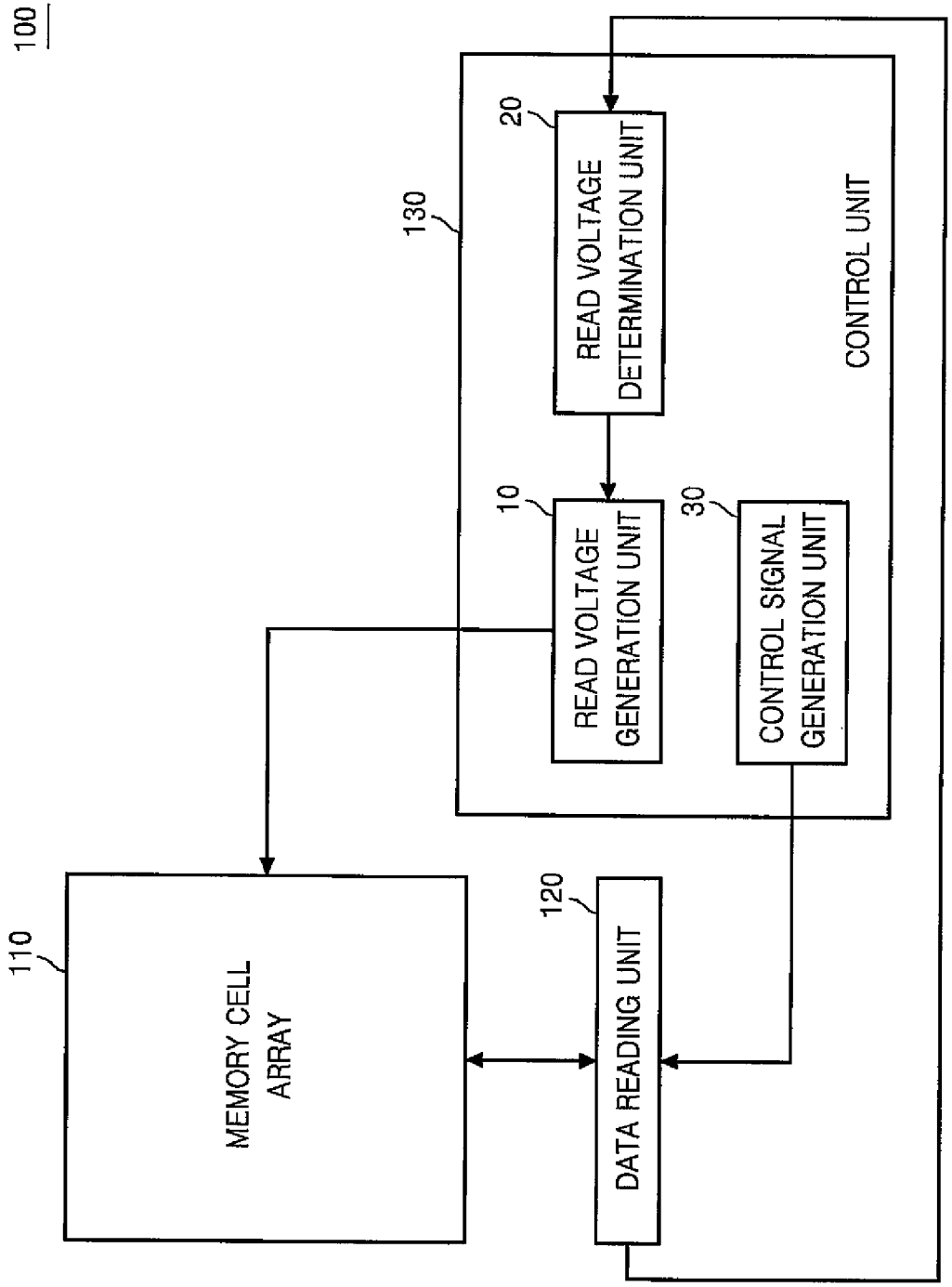
FIG. 2 is a block diagram of a non-volatile semiconductor memory device according to an embodiment of the inventive concept.

FIG. 2 is a block diagram of a non-volatile semiconductor memory device 100 according to an embodiment of the inventive concept. Referring to FIG. 2, the memory device 100 comprises a memory cell array 110, a data reading unit 120, and a control unit 130. The memory cell array 110 includes a plurality of memory cells, each capable of storing N-bit data, where N is a positive integer, according to corresponding logic levels based on a quantity of electrons injected onto a constituent floating gate. The memory cells of memory array 110 may thus be classified into a signal level cell (SLC) type capable of storing 1 bit of data per memory cell, or a multi level cell (MLC) type capable of storing 2 or more bits of data per memory cell.

The data reading unit 120 controls read operations directed to the memory cell array 110 under the control of the control unit 130. The control unit 130 controls various operations performed within the memory device 100. For example, the control unit 130 controls program (or write) operations that store data in the memory cells of the memory cell array 110, as well as read operations retrieving stored data from the memory cell array 110 and erase operations directed to the memory cell array 110. To this end, the control unit 130 includes a read voltage generation unit 10, a read voltage determination unit 20, and a control signal generation unit 30.

The control signal generation unit 30 provides various control signal(s) so that the data reading unit 120 may read data from the memory cell array 110.

The read voltage generation unit 10 generates a read voltage and applies the read voltage to the memory cell array 110 under the control of the read voltage determination unit 20. Within embodiments of the inventive concept, when threshold voltage migration occurs in memory cells of the memory cell array 110 under the stress of repeated program/erase cycles, the read voltage determination unit 20 determines an appropriate read voltage level in relation to this threshold voltage migration in order to reduce the occurrence of data read errors.

To this end, the read voltage determination unit 20 determines an optimal read voltage by changing an initial read voltage based on "comparative data" extracted (or calculated) from data read stored in the memory cell array 110. During the determination of the optimal read voltage, certain "reference data" is also extracted (or calculated) from data stored during previous program operations performed in relation to the memory cell array 110.

Figure 3:
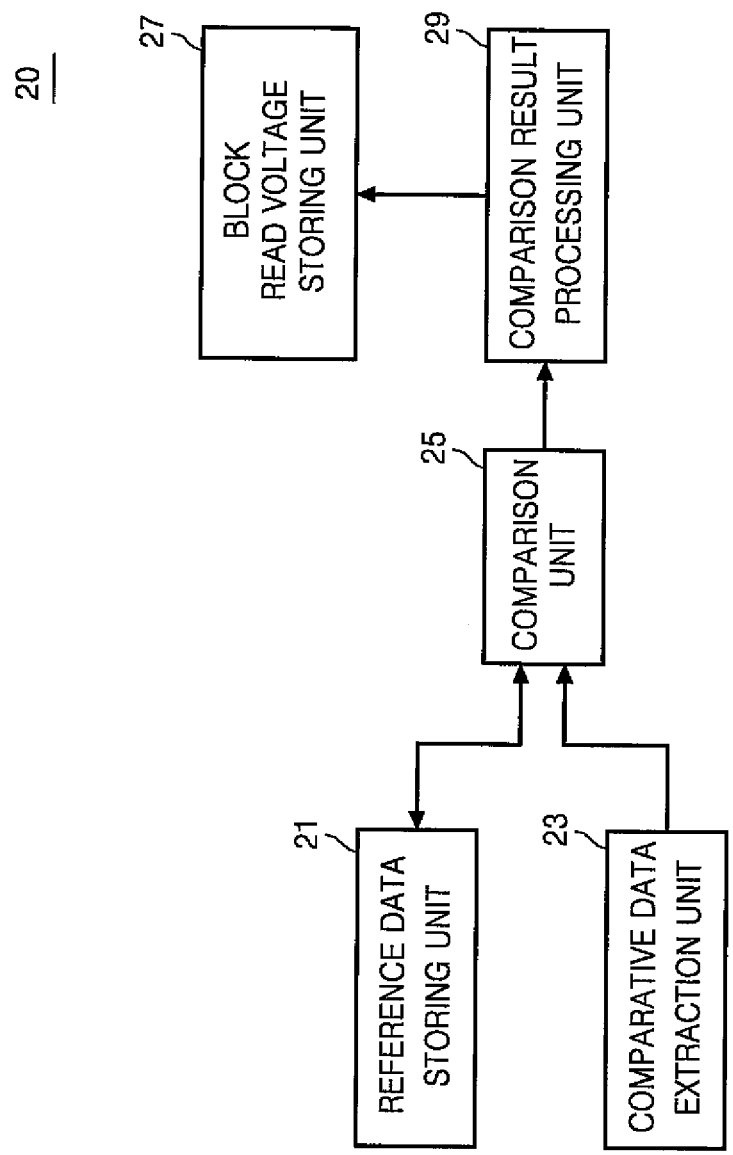
FIG. 3 is a block diagram of the read voltage determination unit of FIG. 2.

FIG. 3 is a block diagram further illustrating in one embodiment of the inventive concept the read voltage determination unit 20 of FIG. 2. Referring to FIG. 3, the read voltage determination unit 20 comprises a reference data storing unit 21, a comparative data extraction unit 23, a comparison unit 25, a block read voltage storing unit 27, and a comparison result processing unit 29.

The reference data storing unit 21 stores reference data extracted from "program data" previously programmed to the memory cell array 110 of FIG. 2. In one possible approach contemplated by the inventive concept, the reference data may be a number of "0" and/or a number of "1's" contained within a defined set of program data. Alternately, when a randomizer capable of randomizing program data is included within a memory device according to an embodiment of the inventive concept, the reference data may be randomized data provided by the randomizer.

The comparative data extraction unit 23 extracts certain read data from the memory cell array 110 as "comparative data" to be compared with the reference data during read voltage determination. In one possible approach contemplated by the inventive concept, the comparative data may be a number of "0" and/or a number of "1's" contained within a defined set of read data.

The comparison unit 25 respectively receives the reference data and the comparative data from the reference data storing unit 21 and the comparative data extraction unit 23, and compares these data values and provides a comparison result.

Upon receiving the comparison result from the comparison unit 25, the comparison result processing unit 29 determines whether any difference between the comparative data and the reference data falls within an error allowable range. The error allowable range is a defined range in which data error that may be generated due to the above difference can be corrected by a given read data error detection/correction capability (ECC) provided within the memory device 100 or in conjunction with other host device elements processing the read data. That is, the error allowable range denotes a difference value within a range in which existing errors in the read data may be detected and corrected by an internal memory device ECC and/or a related processing element ECC (e.g., a digital signal processor). For example, when an ECC is capable of detecting a data error up to 16 bits, if the data error that may be generated due to the difference between the comparative data and the reference data falls within a range of 16 bits, the generated data error is determined to be "within the error allowable range". That is, when the difference value is not greater than 4, the data error is determined to be within the error allowable range.

When the difference between the comparative data and the reference data falls within the error allowable range, the comparison result processing unit 29 determines that the "current read voltage" being used at that time as an "optimal read voltage", and stores the read voltage in the block read voltage storing unit 27. Thus, in this context, the term "optimal read voltage" may be viewed as any read voltage sufficient to allow the difference between the comparative data and the reference data to fall within a defined error allowable range. That is, when a plurality of memory blocks is defined within the memory cell array 110 of FIG. 2, as is common, the block read voltage storing unit 27 may store data indicating optimal read voltage(s) for the plurality of memory blocks. In this regard, an optimal read voltage stored for one memory block may be used as an initial read voltage for a read voltage determination for another memory block.

When the difference between the comparative data and the reference data falls outside of the error allowable range, the comparison result processing unit 29 transmits a read voltage control signal to the read voltage generation unit 10 of FIG. 2 to generate a "new read voltage" suitable to the determined difference. When the data stored in the memory cell array 110 of FIG. 2 is read in relation to a new read voltage, the comparative data extraction unit 23 again extracts the comparative data from the read data and transmits the extracted comparative data to the comparison unit 25. Then, the comparison unit 25 again compares the comparative data to the reference data and a comparison result is transmitted to processing unit 29 as described above.

Figure 4:
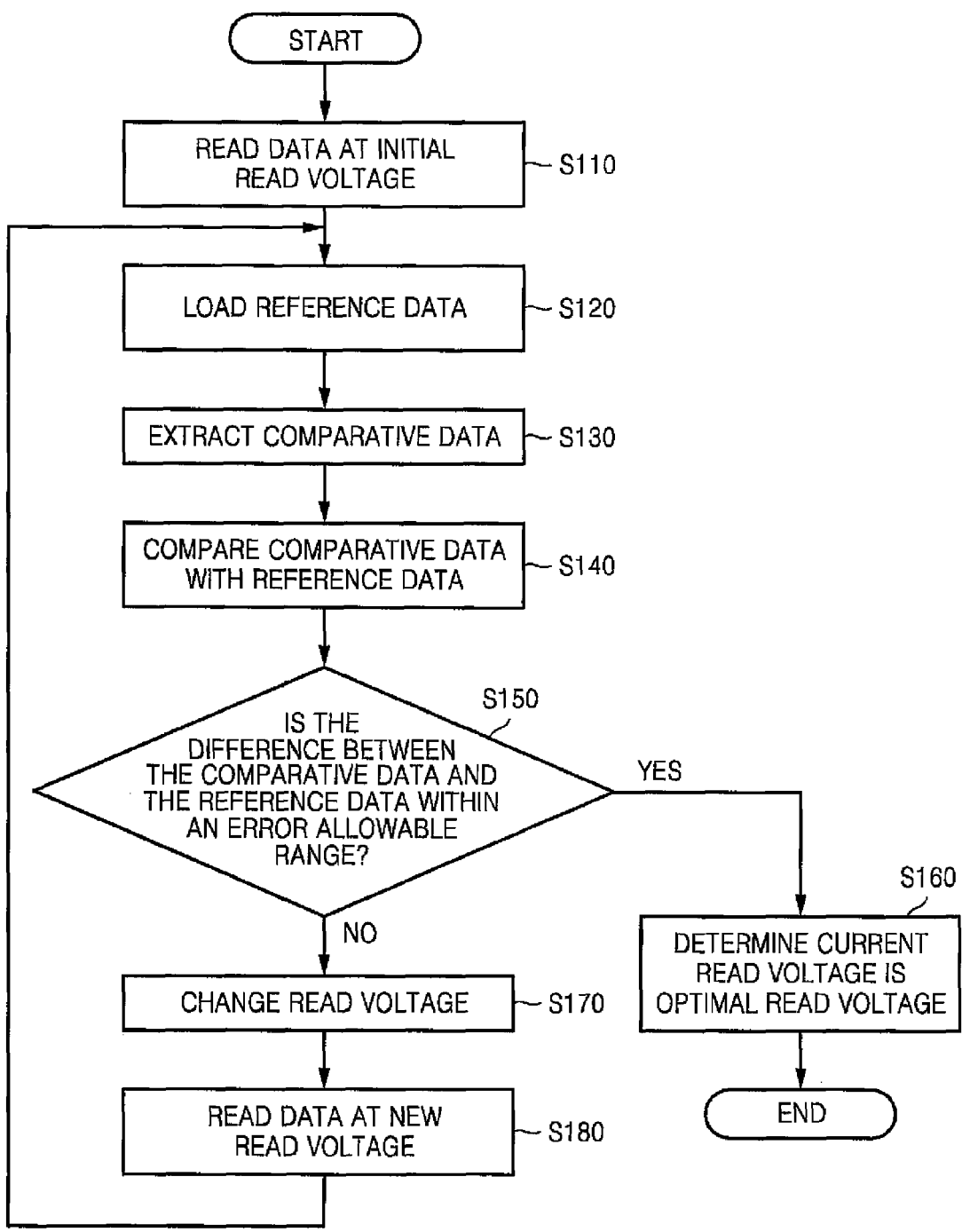
FIG. 4 is a flowchart summarizing a method for determining a read voltage in a memory device according to an embodiment of the inventive concept.

FIG. 4 is a flowchart summarizing a method of determining a read voltage within a non-volatile semiconductor memory device according to an embodiment of the inventive concept. The method of FIG. 4 will be described in the context of the memory device 100 described in relation to FIGS. 2 and 3. Referring to FIGS. 2-4, according to the exemplary method of determining a read voltage, the read voltage determination unit 20 retrieves "read data" from the memory cell array 110 using an initial read voltage (S110). The initial read voltage may be either a basic read voltage defined in the memory device 100, or a voltage determined to be an optimal read voltage for a previously processed memory block in the memory device 100.

During a program operation, for example, reference data may be extracted from program data and stored within the memory device 100. This reference data is now loaded to the reference data storing unit 21 (S120). Reference data may be various generated and defined as noted above.

The comparative data extraction unit 23 now extracts comparative data from the read data (S130). Again, comparative data may be various generated and defined as noted above.

The comparison unit 25 now compares the comparative data and the reference data (S140). Based on a comparison result provided by the comparison unit 25, the comparison result processing unit 29 may now determine whether the current read voltage (i.e., the initial read voltage in the working example) is an optimal read voltage (S150). If not, the comparison result processing unit 29 determines a new read voltage that qualifies as an optimal read voltage by changing the current (initial) read voltage.

Thus, as a result of the comparison, when a difference between the comparison data and the references data falls within an error allowable range (S140 and S150), the comparison result processing unit 29 may (1) determine that the current read voltage is an optimal read voltage (S150=YES and S160), or (2) determine that the current read voltage must be changed (S150=NO and S170).

When the comparison result processing unit 29 determines that the current read voltage must be changed it may, for example, transmit a read voltage control signal to the read voltage generation unit 10, thereby causing an appropriate voltage level for the read voltage to be generated in view of the degree of difference. In response, the read voltage generation unit 10 supplies a "new read voltage" to the memory cell array 110 to "re-read" the read data using the new read voltage. The data reading unit 120 then reads data using the new read voltage (S180), and the read voltage determination loop repeats (S120 through 150).

FIG. 5 is a flowchart further explaining the step (S170) of changing the read voltage in the method of FIG. 4 according to an embodiment of the inventive concept. Referring to FIG. 5, the read voltage determination unit 20 first determines the necessary change in the level of the current read voltage based on the difference (e.g., a comparatively determined difference value) between the reference data and the comparative data (S171). That is, the degree of change from the current read voltage (e.g., the initial read voltage in the working example) may be determined on a proportional basis from a difference value calculated between the comparative data and the reference data. To this end, the read voltage determination unit 20 may in certain embodiments of the inventive concept include a table containing read voltage change values corresponding to difference values between the comparative data and the reference data. This table may be referred to during S171. Accordingly, by determining a degree or level of change in relation to the current read voltage on a "look-up" proportional basis, a difference value between the reference data and the comparative data likely to result in conversion of the current read voltage to an optimal read voltage may be quickly calculated. That is, since a large difference between the reference data and the comparative data indicates a large threshold voltage migration for memory cells, the period of time that must be allocated to the identification of an optimal read voltage may be reduced by increasing the range and accuracy of changes made to a current (non-optimal) read voltage.

Continuing with the example illustrated in FIG. 5, when the comparative data is less than the reference data, the read voltage determination unit 20 changes the current read voltage such that the comparative data is increased (S173=YES and S175). Otherwise, the read voltage determination unit 20 changes the current read voltage such that the comparative data is decreased (5173=NO and S177). That is, the current read voltage is changed to limit the difference between the comparative data and the reference data such that it falls within the error allowable range. To this end, the read voltage determination unit 20 outputs a read voltage control signal to change the current read voltage to the read voltage generation unit 10 so that the read voltage generation unit 10 may output an optimal read voltage to the memory cell array 110. Hence, operations S175 and S177 increase or decrease the current read voltage by as much as is necessary to change in the current read voltage in relation to the determination made in S171.

For example, for a memory cell having the cell distribution of FIG. 6A, when data is read at an initial read voltage V_R, memory cells in the cell distribution P0 are identified as memory cells storing a data value of "0". However, as time passes following repeated program/erase cycles, the threshold voltage of the memory cells in the memory cell array 110 are assumed to decrease so that the cell distribution P0 migrates to a cell distribution P0' as illustrated in FIG. 6B. In this state, when data is read using the initial read voltage V_R, the memory cells located in a hatched portion of the cell distribution P0' may not be identified as the memory cells storing a data value of "0". Thus, data errors are generated by read operations directed to memory cells falling within the hatched portion of FIG. 6B.

However, according to a method consistent with an embodiment of the inventive concept, since the read voltage may be effectively changed based on a difference between the number of memory cells identified as storing a data value of "0" when data is read using the initial read voltage V_R from memory cells having the cell distribution of FIG. 6A, and the number of memory cells identified as storing a data value of "0" when data is read at the initial read voltage V_R from memory cells having the cell distribution of FIG. 6B, such data errors may be reduced. That is, to allow the memory cells corresponding to the hatched portion of FIG. 6B to be properly identified as memory cells storing a data value of "0", the initial read voltage V_R must be changed to a new read voltage V_R', by subtracting a voltage difference "A". In particular, since the degree of change from the initial read voltage to the new read voltage may be adjusted on a proportional basis in view of the difference value, an optimal read voltage may be quickly obtained.

Figure 8:
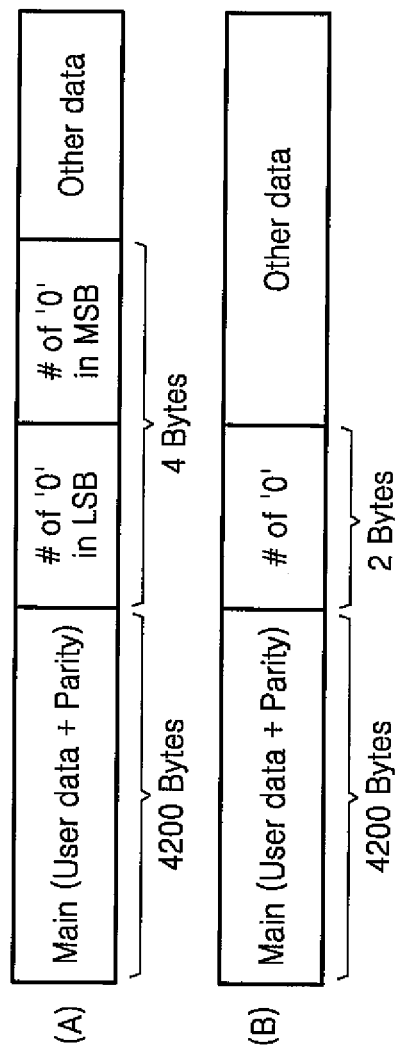
Figure 9:
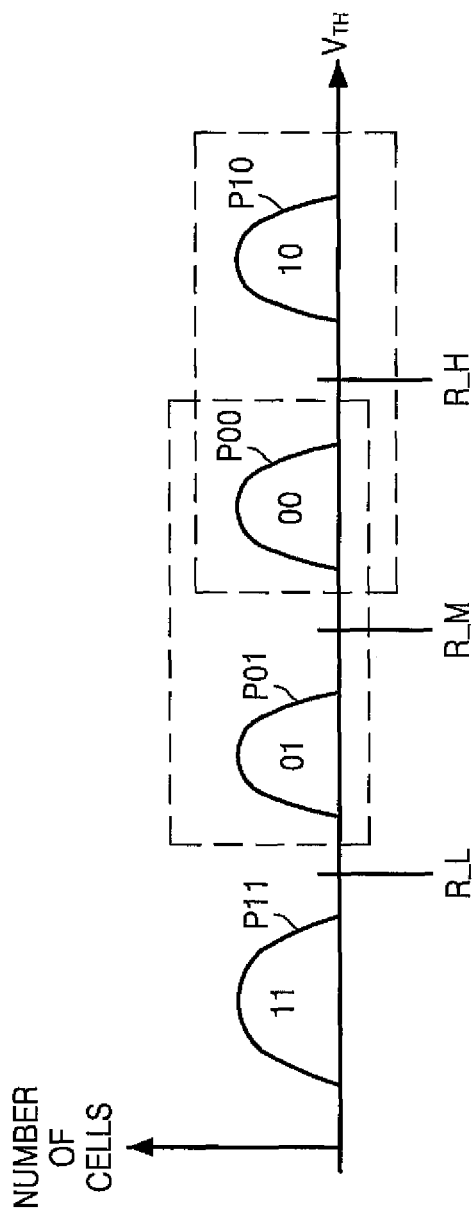

FIGS. 7-9 are graphs and diagrams explaining various embodiments of the inventive concept as applied to a memory device including a 2-bit MLC memory cell. FIG. 7 illustrates a case in which data is written to the 2-bit MLC memory cell. In FIG. 7, a graph (a) illustrates a cell distribution in an erase state, a graph (b) illustrates a cell distribution in an LSB program state, and a graph (c) illustrates a cell distribution in an MSB program state.

When the memory cells are programmed as above, the memory device according to an embodiment of the inventive concept counts and stores the number of "0's" for each program state. That is, for the LSB program state, the number of memory cells included in the cell distribution are counted and stored, and for the MSB program state, the number of memory cells included in the cell distribution of "P10" and "P00" are counted and stored.

FIG. 8 illustrates an example of storing the number of "0's" corresponding to the LSB and MSB in the 2-bit MLC memory cell programmed as in FIG. 7. In FIG. 8, a diagram (a) illustrates an example of storing the number of "0's" in each of the LSB and MSB program states in separate cells. A diagram (b) illustrates an example of storing the number of "0's" in each of the LSB and MSB program states in the same cells. In the illustrated embodiment of the inventive concept, both of the diagrams (a) and (b) may be available, but the diagram (a) is more reliable than the diagram (b). Although the number of "0" in each of the LSB and MSB program states may be stored in a particular area of the memory cell array 110 as described above, the number of "0" may alternately be stored in a logic area such as a register.

Also, as illustrated in FIG. 9, the read voltage in the LSB program state is R_M and the read voltage in the MSB program state is R_L and R_H. Thus, in the 2-bit MLC memory cell, the read voltage determination unit 20 of FIGS. 3 and 4 according to the illustrated embodiment of the inventive concept increases the number of "0" that are read, by decreasing the read voltage R_M during the next read operation when the number of "0's" that are read in an LSB read state is less than the number of "0" that are written. Otherwise, the read voltage determination unit 20 decreases the number of "0's" that are read, by increasing the read voltage R_M.

On the other hand, in the 2-bit MLC memory cell, the read voltage determination unit 20 increases the number of "0" that are read, by increasing the read voltage R_H during the next read operation when the number of "0" that are read in an MSB read state is less than the number of "0's" that are written. Otherwise, the read voltage determination unit 20 decreases the number of "0" that are read, by decreasing the read voltage R_H.

In the MSB state, the error due to the read voltage R_H is greater than that due to the read voltage R_L. This is because more data errors are generally generated in a cell having a high threshold voltage. Accordingly, in the above-described embodiment, data error is corrected by using the read voltage R_H only for the data error in the MSB state. However, the scope of the inventive concept is not limited thereto. That is, an optimal read voltage may be determined by changing the read voltage R_L in the opposite direction while fixing the read voltage R_H, or while simultaneously and appropriately moving both of the read voltages R_H and R_L.

The method of determining a read voltage in non-volatile memory devices according to an embodiment of the inventive concept may be embodied as programming or control code stored in one or more computer readable recording medium. The computer readable recording medium is any data storage device that may store data which may be thereafter read by a computer system. Examples of the computer readable recording medium include read-only memory (ROM), random-access memory (RAM), CD-ROMs, magnetic tapes, floppy disks, optical data storage devices, etc. The computer readable recording medium may also be distributed over network coupled computer systems so that the computer readable code is stored and executed in a distributed fashion. Also, functional programs, codes, and code segments for accomplishing the present invention may be easily construed by programmers skilled in the art to which the present inventive concept pertains.

The non-volatile memory device and/or the memory controller according to the present exemplary embodiment may be implemented by using a variety of packages. For example, the non-volatile memory device and/or the memory controller according to the present exemplary embodiment may be implemented by using packages such as package on packages (PoPs), ball grid arrays (BGAs), chip scale packages (CSPs), plastic leaded chip carriers (PLCCs), plastic dual in-line packages (PDIPs), die in waffle packs, die in wafer forms, chip on boards (COBs), ceramic dual in-line packages (CERDIPs), plastic metric quad flat packs (MQFPs), thin quad flatpacks (TQFPs), small outlines (SOICs), shrink small outline packages (SSOPs), thin small outlines (TSOPs), thin quad flatpacks (TQFPs), system in packages (SIPs), multi chip packages (MCPs), wafer-level fabricated packages (WFPs), and wafer-level processed stack packages (WSPs).

Also, one or more non-volatile memory device(s) and a related memory controller according to an embodiment of the inventive concept may constitute a memory card. In this case, the memory controller may be configured to communicate with an external apparatus (e.g., a host device) through one of various conventionally understood interface protocols such as USB, MMC, PCI-E, SATA, PATA, SCSI, ESDI, and IDE.

Figure 10:
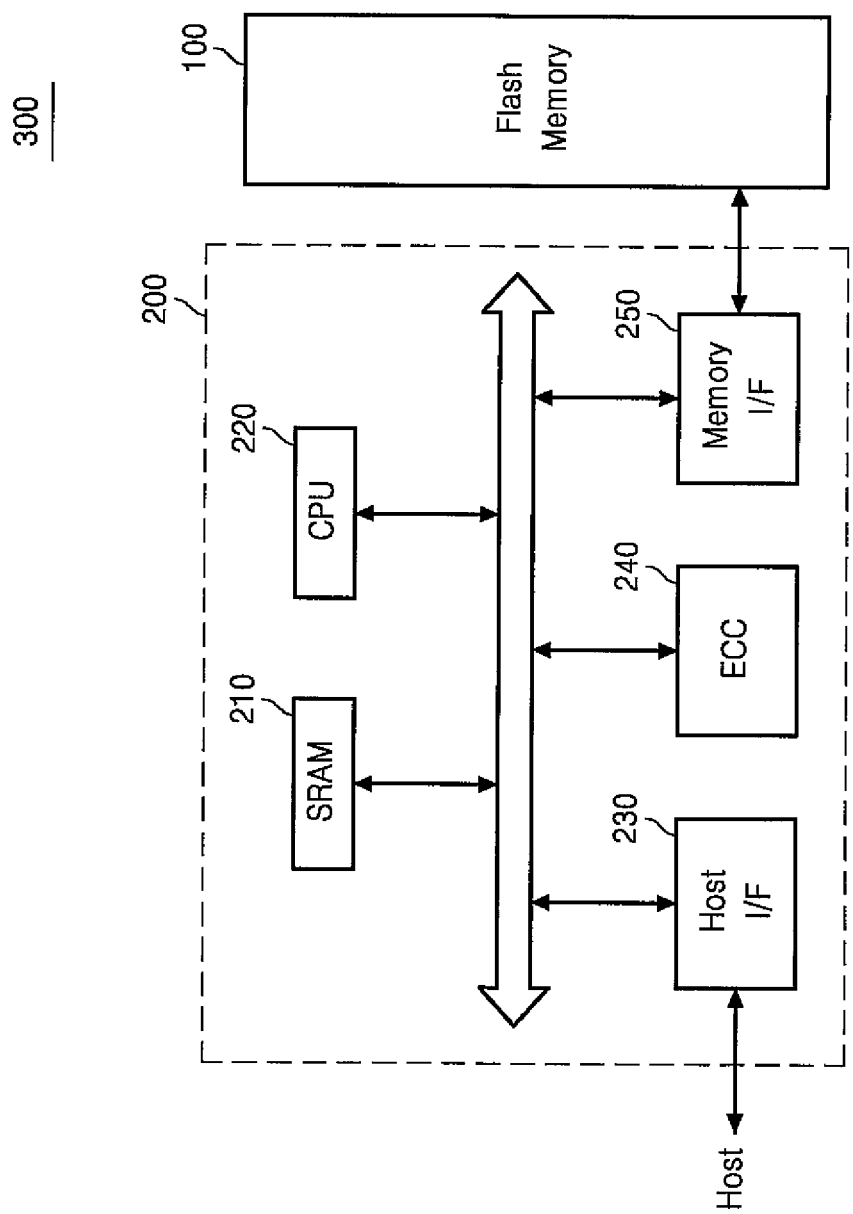
FIG. 10 is a block diagram of a memory card incorporating a memory device according to an embodiment of the inventive concept.

FIG. 10 is a block diagram of a memory card 300 incorporating a non-volatile memory device according to an embodiment of the inventive concept. Referring to FIG. 10, the memory card 300 comprises a flash memory 100 and memory controller 200 controlling the exchange of data between the host device and the flash memory 100. The flash memory 100 may compare reference data derived from previously stored data with comparative read derived during a read, and determine an optimal read voltage based on a resulting comparative difference value.

In the illustrated embodiment, the memory controller 200 comprises a static random access memory (SRAM) 210, a central processing unit (CPU) 220, a host interface (Host I/F) 230, an error correction code (ECC) block 240, and a memory interface (Memory I/F) 250. The SRAM 210 is used as an operation memory of a central processing unit 220. The host interface 230 is provided with data exchange protocols of the host connected to the memory card 300. The ECC block 240 detects and corrects an error included in the data read from the flash memory 100. The memory interface 250 interfaces with the flash memory 100 of the present exemplary embodiment. The CPU 220 performs general control operations for data exchange of the memory controller 200. Although it is not illustrated in the drawings, the memory card 300 may further include a ROM storing code data for interfacing with the host, which is well known to one skilled in the art to which the present inventive concept pertains.

Figure 11:
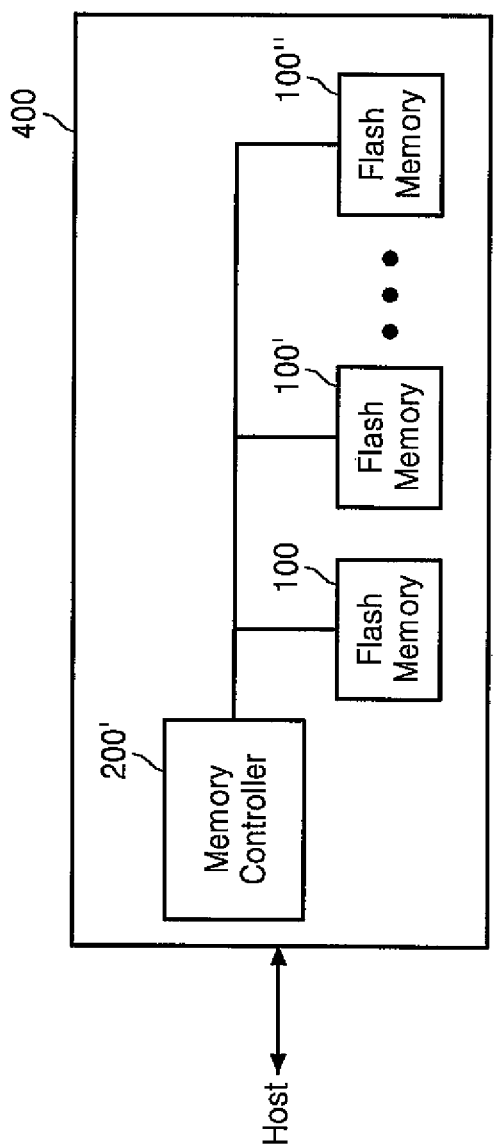
FIG. 11 is a block diagram of a memory card incorporating a memory device according to another embodiment of the inventive concept.

Although, in the memory card 300 of FIG. 10, the memory controller 200 is configured to control a single flash memory, that is the flash memory 100, a memory card 400 including one or more flash memories may be configured as illustrated in FIG. 11. That is, referring to FIG. 11, a memory controller 200' may control one or more flash memories 100, 100', . . . , 100" connected in parallel.

Also, the flash memory is a non-volatile memory device capable of keeping stored data when power is discontinued, and may be widely used not only as a data storage but also as a code storage as the use of mobile devices such as cellular phones, PDAs, digital cameras, portable game consoles, and MP3 players increases. The flash memory may be used for home applications such as HDTVs, DVDs, routers, and GPSs.

Figure 12:
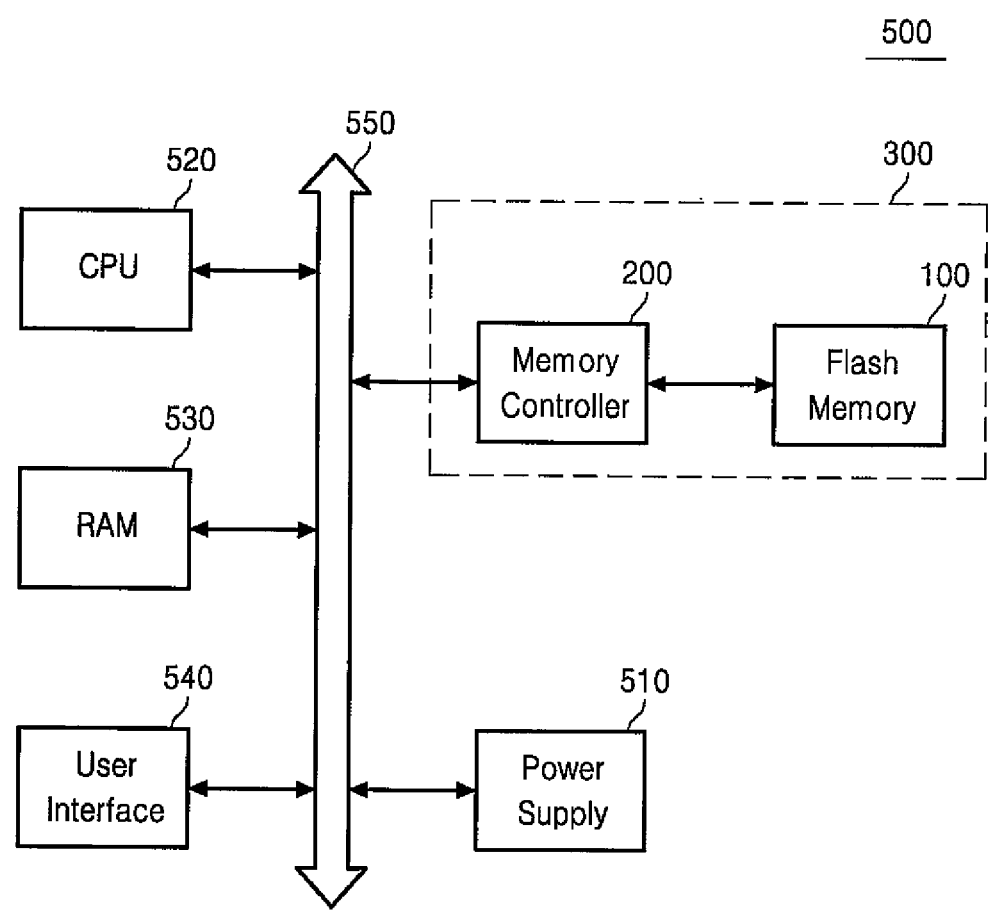
FIG. 12 is a block diagram of a system incorporating a memory device according to an embodiment of the inventive concept.

The non-volatile memory device according to an embodiment of the inventive concept may be installed at a computing system, for example, systems such as mobile devices or desktop computers, of which an example is illustrated in FIG. 12. FIG. 12 is a block diagram of a system 500 having a non-volatile semiconductor memory device according to an embodiment of the inventive concept. Referring to FIG. 12, the system 500 with a non-volatile memory device includes the memory card 300 having the flash memory 100 and the memory controller 200, a power supply 510, a CPU 520, a RAM 530, a user interface 540, which are electrically connected in a system bus 550.

The CPU 520 controls the overall operation of the system 500. The RAM 530 stores information needed for the operation of the system 500. The user interface 540 provides interface between the system 500 and a user. The flash memory 100 may be configured to be substantially the same as the non-volatile memory device described in FIG. 2. The flash memory 100 stores the N-bit data, where N is 1 or an integer greater than 1, that is provided through the user interface 540 or processed or will be processed by the CPU 520, via the memory controller 200. In particular, the flash memory 100 calculates a read voltage based on a result of comparison between reference data, for example, the number of "0's" included in program data, that is previously stored, during programming, and comparative data, for example, the number of "0" included in read data, that is read, during reading, and reads data by generating the calculated voltage during data reading. The memory controller 200 controls the programming and reading operations of the flash memory 100.

Although in FIG. 12 the flash memory 100 and the memory controller 200 together constitute a single memory card, that is, the memory card 300, the flash memory 100 and the memory controller 200 may be separately configured. Although it is not illustrated in the drawings, the system may be further provided with application chipsets, camera image processors (CISs), or mobile DRAMs, which is well known to one skilled in the art to which the present inventive concept pertains. The memory controller and the flash memory may constitute, for example, a solid state drive/disk (SSD) using a non-volatile memory for storing data.

As described above, according to the present inventive concept, when the threshold voltage of memory cells is dropped or raised, an optimal read voltage may be quickly calculated. Thus, a data error generated due to a change in the read voltage may be reduced. In particular, according to the present inventive concept, what is the optimal read voltage or how far the current read voltage is deviated from the optimal read voltage may be checked or calculated with only one time of read.

While the inventive concept has been particularly shown and described with reference to exemplary embodiments thereof, it will be understood that various changes in form and details may be made therein without departing from the scope of the following claims. For example, although the inventive concept has been described in relation to a SLC type or a 2-bit MLC type, it is not limited thereto. That is, the inventive concept may be applied to all semiconductor memory devices including a memory cell having a characteristic that the oxide film is deteriorated due to the repetition of a program/erase cycle so that the threshold voltage of each memory cell may be changed. For example, the inventive concept may be applied to a memory device having a 3-bit MLC memory cell. Thus, the scope of the inventive concept may be determined by the following claims.

What is claimed is:

1. A method determining a read voltage in a non-volatile semiconductor memory device including a memory cell array of non-volatile memory cells, the method comprising:
    obtaining read data by reading the nonvolatile memory cells using a current read voltage, wherein the nonvolatile memory cells is disposed in a portion of the memory cell array capable of storing program data during a program operation initiated by a user input received via a user interface;
    extracting comparative data from the read data by calculating a first number of a data value stored in the nonvolatile memory cells;
    extracting reference data from program data programmed in the nonvolatile memory cells during a program operation initiated by a user input received via the user interface by calculating a second number of the data value stored by the nonvolatile memory cells;
    comparing the comparative data with the reference data to generate a comparison result;
    determining on the basis of the comparison result whether or not the current read voltage is an optimal read voltage; and
    when the current read voltage is determined not to be an optimal voltage, changing the current read voltage to a new read voltage on the basis of a difference value between the first and second numbers.

2. The method of claim 1, wherein determining on the basis of the comparison result whether the current read voltage is an optimal read voltage comprises:
    determining whether the difference value falls within an error allowable range.

3. The method of claim 2, wherein changing the current read voltage to a new read voltage comprises:
    changing the current read voltage by a degree proportional to the difference value.

4. The method of claim 1, wherein the plurality of memory cells are divided into a plurality of memory blocks, and the current read voltage is an optimal read voltage for a first memory block in the plurality of memory blocks, and
    the method of determining the read voltage is applied to a second memory block different from the first memory block in the plurality of memory blocks.

5. The method of claim 1, wherein the program data was programmed to the nonvolatile memory cells by a program operation performed before the read data is obtained by reading the nonvolatile memory cells, and the method further comprises:
    storing the reference data in a reference data storing unit external to the memory cell array.

6. The method of claim 5, wherein the storing of the reference data in the reference data storing unit is performed before comparing the comparative data with the reference data.

7. The method of claim 1, further comprising:
    randomizing the programming of the program data during the program operation, such that the plurality of memory cells is randomly distributed across the entire memory cell array.

8. A non-volatile semiconductor memory device comprising:
    a memory cell array including a plurality of nonvolatile memory cells, wherein each one of the plurality of non-volatile memory cells is configured to store program data during a program operation initiated by a user input received via a user interface;
    a read voltage determination unit configured to determine an optimal read voltage by:
        obtaining read data by reading the plurality of nonvolatile memory cells using a current read voltage, and extracting comparative data from the read data;
        extracting reference data from the program data programmed in the plurality of nonvolatile memory cells;
        comparing the reference data with the comparative data to generate a comparison result; and
        generating a read voltage control signal based on the comparison result; and
    a read voltage generation unit configured to generate a new read voltage instead of the current read voltage in response to the read voltage control signal provided by the read voltage determination unit.

9. The non-volatile semiconductor memory device of claim 8, wherein the read voltage determination unit comprises:
    a reference data storing unit configured to store the reference data;
    a comparative data extraction unit configured to extract the comparative data from read data;
    a comparison unit configured to compare the reference data with the comparative data and generate the comparison result; and
    a comparison result processing unit configured to determine whether the current read voltage is an optimal read voltage on the basis of the comparison result.

10. The non-volatile semiconductor memory device of claim 9, wherein the comparative data extraction unit extracts the comparative data from the read data by calculating a first number of a data value stored by the plurality of nonvolatile memory cells,
    the reference data storing unit extracts the reference data from the program data by calculating a second number of the data value stored by the plurality of nonvolatile memory cells, and
    the comparison result is a difference value between the first and second numbers.

11. The non-volatile semiconductor memory device of claim 9, wherein the plurality of memory cells is divided in a plurality of memory blocks; and
    the read voltage determination unit further comprises a block read voltage storing unit configured to store an optimal read voltage for each one of the plurality of memory blocks.

12. The non-volatile semiconductor memory device of claim 9, further comprising:
    a randomizer that randomizes the program data stored in the plurality of nonvolatile memory cells during the program operation, such that the plurality of nonvolatile memory cells are randomly distributed across the memory cell array.

13. A memory card comprising:
a non-volatile semiconductor memory device and a memory controller controlling execution of a program operation initiated by a user input received via a user interface, wherein the non-volatile semiconductor memory device comprises:
a memory cell array including a plurality of memory cells, wherein each one of the plurality of memory cells is configured to store program data during the program operation;
a read voltage determination unit configured to determine an optimal read voltage by obtaining read data by reading the plurality of memory cells using a current read voltage and extracting comparative data from the read data, extracting reference data from program data programmed in the plurality of memory cells, comparing the reference data with the comparative data to generate a comparison result, and generating a read voltage control signal based on the comparison result; and
a read voltage generation unit configured to generate a new read voltage instead of the current read voltage in response to the read voltage control signal provided by the read voltage determination unit.

14. A system comprising:
a central processing unit that controls overall operation of the the memory card defined in claim 13,
wherein the memory controller controls execution of the program operation by the non-volatile semiconductor memory device under the control of the central processing unit.

* * * * *